United States Patent
Ingenbleek et al.

(10) Patent No.: US 7,911,051 B2
(45) Date of Patent: Mar. 22, 2011

(54) ELECTRONIC CIRCUIT ARRANGEMENT AND METHOD FOR PRODUCING AN ELECTRONIC CIRCUIT ARRANGEMENT

(75) Inventors: Robert Ingenbleek, Kressbronn a.B. (DE); Erik Jung, Falkensee (DE); Alfred Kolb, Friedrichshafen (DE); Andreas Rekofsky, Duggendorf/Hochdorf (DE); Roland Schöllhorn, Friedrichshafen (DE); Daniela Wolf, Regensburg (DE)

(73) Assignee: Continental Automotive GmbH, Munich (DE)

( * ) Notice: Subject to any disclaimer, the term of this patent is extended or adjusted under 35 U.S.C. 154(b) by 298 days.

(21) Appl. No.: 12/093,332

(22) PCT Filed: Oct. 5, 2006

(86) PCT No.: PCT/EP2006/067101
§ 371 (c)(1),
(2), (4) Date: Jul. 15, 2008

(87) PCT Pub. No.: WO2007/054409
PCT Pub. Date: May 18, 2007

(65) Prior Publication Data
US 2009/0161319 A1 Jun. 25, 2009

(30) Foreign Application Priority Data

Nov. 11, 2005 (DE) .......................... 10 2005 053 974

(51) Int. Cl.
*H01L 23/34* (2006.01)

(52) U.S. Cl. ........ 257/712; 257/705; 257/706; 257/707; 257/711; 257/685; 257/723; 257/E25.005; 257/E25.011; 257/E25.012; 257/E25.016; 257/E25.02; 257/E25.026; 257/E23.001; 257/E23.051; 257/E23.103

(58) Field of Classification Search .................. 257/705, 257/706, 707, 711, 713, 700–703, 723, 685, 257/E25.005, E25.011, E25.012, E25.015, 257/E25.016, E25.02, E25.026, E23.001, 257/E23.051, E23.103; 361/679.46, 679.54, 361/688, 697, 746; 174/548
See application file for complete search history.

(56) References Cited

U.S. PATENT DOCUMENTS

| | | | |
|---|---|---|---|
| 5,297,006 A * | 3/1994 | Mizukoshi | .................. 361/704 |
| 5,856,911 A | 1/1999 | Riley | |
| 2002/0008963 A1 | 1/2002 | Dibene, II et al. | |
| 2005/0152117 A1 | 7/2005 | Belady et al. | |

FOREIGN PATENT DOCUMENTS

| | | |
|---|---|---|
| DE | 4030532 A1 | 4/1992 |
| DE | 19859739 A1 | 7/2000 |
| EP | 0219627 B1 | 6/1991 |

* cited by examiner

*Primary Examiner* — Jasmine J Clark
(74) *Attorney, Agent, or Firm* — Laurence A. Greenberg; Werner H. Stemer; Ralph E. Locher

(57) ABSTRACT

An electronic circuit arrangement includes a heat sink and a first circuit carrier which is thermally coupled to the heat sink, lies flat on the latter and is intended to wire electronic components of the circuit arrangement. Provided for at least one electronic component is a special arrangement which is associated with a considerably increased heat dissipation capability for the relevant component and, in addition, also affords further advantages in connection with changes in the population and/or line routing which might occur in practice. The important factor for this is that the component is arranged under a second circuit carrier which is held in a recess in the first circuit carrier. The recess passes through to the top side of the heat sink.

20 Claims, 2 Drawing Sheets

ELECTRONIC CIRCUIT ARRANGEMENT AND METHOD FOR PRODUCING AN ELECTRONIC CIRCUIT ARRANGEMENT

BACKGROUND OF THE INVENTION

Field of the Invention

The invention relates to an electronic circuit arrangement and a method for producing an electronic circuit arrangement, especially for use in the field of motor vehicle electronics.

It is known that in the design of electronic units including a circuit carrier (e.g. circuit board, ceramic, flex film, etc) populated by at least one electronic component, the best possible dissipation of the heat, which unavoidably occurs as thermal power loss during the operation of electronic components, is to be provided. The heat dissipation extends the service life of the components and thus increases the reliability of the electronic devices formed thereby.

Previous attempts to improve the heat dissipation consist mainly of attempts to improve the thermal connection of the electronic component to its environment, for example, by providing heat dissipation paths with a high heat conductivity within a circuit carrier (e.g. "horizontal heat spread") and/or by fitting a heatsink, designed specially for the purpose, in good thermal contact with the component.

The known measures for improving the heat dissipation are often associated with considerable cost, especially if the relevant circuit arrangement generates a particularly high power loss and/or is designed to be operated in an environment with a relatively high ambient temperature, such as for example is the case with control electronic units in automotive engineering. In this case, such units are increasingly arranged in the area of vehicle components with an elevated temperature, for example engine, gearbox or brakes. Furthermore, special heat dissipation measures frequently hinder a space-saving layout of printed conductors of the particular circuit carrier.

A further disadvantage of known circuit arrangements is their frequently inadequate flexibility with respect to relatively small changes in their population with electronic components and/or the line routing between these components. An example of this is that a circuit carrier developed for an engine control unit in a motor vehicle and populated mainly by a microcontroller chip usually has to be extensively altered or redesigned if the engine control unit is to be provided with a modern microcontroller chip for a future series. The preceding development expenditure is then to a large extent worthless because the previous circuit carrier cannot be further used for the new series.

BRIEF SUMMARY OF THE INVENTION

The object of this invention is to remove the aforementioned disadvantages and particularly to provide an electronic circuit arrangement and a method for producing such a circuit arrangement which can combine a good heat dissipation capability with a high degree of flexibility with respect to the technical circuit changes occurring in practice.

This object is achieved by an electronic circuit arrangement as claimed in claim 1 and a method for producing an electronic circuit arrangement as claimed in claim 15. The dependent claims refer to advantageous developments of the invention.

The invention initially adopts a cost-effective concept, known per se, which is very advantageous with respect to heat dissipation, when a circuit carrier (referred to in the following as "first circuit carrier") is thermally coupled to a heatsink and lies flat on a top side of the latter.

As claimed in the invention, for at least one electronic component of the circuit arrangement a special integration or arrangement is, however, provided, which is associated with a substantially increased heat dissipation capability for the relevant component and furthermore surprisingly offers still further advantages in connection with changes in the population and/or line routing which might occur in practice. An important factor for this is the provision of at least one further circuit carrier, also referred to in the following as a "second circuit carrier", by means of which an practice very easily adapted population or electrical contact of the relevant component(s) is achieved. Furthermore, the second circuit carrier is significant in connection with an optimum heat dissipation from the relevant component(s) to the heatsink. These advantages are further detailed in the following.

The heatsink, which for example can also form part of a housing of an associated electronic unit, is preferably made of a material with a high heat conductivity (e.g. such as a metal plate).

For a simple construction of the circuit arrangement and especially for a thermal coupling between the first circuit carrier and the heatsink which is easy and efficient to realize, it is advantageous if the heatsink has a flat top side. Especially if the first circuit carrier also is plate shaped with a flat underside, the thermal coupling can be easily achieved, e.g. by interposing a heat-conducting film or a heat-conducting adhesive.

The first circuit carrier can be populated with electronic components of the circuit arrangement in a known manner on the side facing away from the heatsink, with the electronic components being electrically connected to each other corresponding to the electrical layout by means of printed conductors on and/or in the circuit carrier.

In view of the particularly interesting use of the circuit arrangement in the field of motor vehicle electronics in the context of the invention and the associated increased requirements for an efficient heat dissipation of the maximum possible number of components, it is provided in one embodiment that the first circuit carrier is designed as a ceramic or as a conventional PCB (printed circuit board).

In one embodiment, it is provided that the second circuit carrier is plate-shaped, for example designed as an essentially rectangular plate.

In a preferred embodiment, the second circuit carrier is designed as an LTCC (Low Temperature Cofired Ceramic) substrate.

For a simple electrical connection between the first circuit carrier and the second circuit carrier, the arrangement provided for this purpose can, for example, include a bond wire arrangement and/or a (for example bonded) printed conductor film. It is also advantageous in this connection if the "contact pads" on the top side of the first circuit carrier and of the second circuit carrier to be electrically connected or joined to each other are at approximately the same height. If both the first and second circuit carriers are each designed as a flat plate, this means that the thickness of the second circuit carrier corresponds approximately to the plate thickness of the first circuit carrier reduced by the relevant component thickness. In principle, it can, however, not be ruled out that the second circuit carrier is thicker or thinner and therefore projects upwards out of the recess (only partially accommodated in the recess) or is lowered into the recess. Such a resulting height difference can easily be bridged, for example by bond wires.

The recess provided to accommodate the second circuit carrier can, in principle, also be provided on the edge of the first circuit carrier, which can be advantageous in certain cases. To achieve the best possible stable arrangement of the second circuit carrier it is, however, quite generally preferred if the recess is provided in a central area of the first circuit carrier. In this case, a mechanically stable mounting of the second circuit carrier is often already guaranteed or further improved by an electrical connecting arrangement running around and/or covering the second circuit carrier.

In a preferred embodiment, the electronic component arranged between the second circuit carrier and the heatsink is an unhoused chip (microelectronic component, especially an integrated circuit arrangement). This results in a certain space saving and furthermore has a further advantage with respect to the dissipation of heat, which in this case can be dissipated directly (not via a housing) to the heatsink.

A particularly good thermal coupling between the component and the heatsink results if, for example, the underside of the component is then thermally coupled with the top of the heat sink and lies flat against it. Furthermore, it is also possible for example for a thin heat-conducting adhesive layer to be inserted in between.

In one embodiment, it is provided that the electronic component arranged between the second circuit carrier and the heatsink is ground on its underside. Such grinding can offer a whole series of advantages, especially if the underside of the component is in contact with the top of the heat sink. This can firstly shorten the heat dissipation path from the electrically active areas of the component to the heatsink (or an intermediate layer) and/or reduce the heat transfer resistance between the component and the top of the heat sink. Furthermore, the height of the component can thus be reduced to a required amount, whether to guarantee a predetermined height of the cluster consisting of the second circuit carrier and component or for matching the thickness of the component to the thickness of one or more other components that are arranged between the same second circuit carrier and the heatsink.

In one embodiment, it is provided that the electronic component arranged between the second circuit carrier and the heatsink is coupled with the top side of the heatsink by means of a heat-conducting filling material, for example a heat-conducting layer of adhesive. The same filling material or a different filling material can also be used to fill the areas between the second circuit carrier and the heatsink that would otherwise be filled with air, e.g. in order to increase the heat dissipation capability. Such a filling material, which, for example, can also have resilient properties, can in many applications also improve the vibration resistance.

The production of an inventive circuit arrangement can, for example, include the following steps:

Provision of a first cluster consisting of a heatsink for dissipating heat and a circuit carrier lying flat on the top side of the heatsink and thermally coupled to said heatsink for wiring electronic components of the circuit arrangement, with the first circuit carrier having a recess passing through to the top side of the heatsink (the first circuit carrier can be populated with components before, during or after its connection to the heatsink. Furthermore, the first circuit carrier can be provided with several such recesses), Provision of a second cluster consisting of a second circuit carrier and an electronic component from which component terminals are electrically connected to underside contact pads of the second circuit carrier (in this case, several components can also be connected in this way to the second circuit carrier and/or several such second combinations can also be provided), Insertion of the second cluster (or of the second clusters) into the recess(es) of the first cluster in such a way that the underside of the electronic component is in thermal contact with the top side of the heatsink, e.g. by lying flat against it, whether directly or indirectly through a heat-conducting intermediate layer (the recess can also be filled at least partially with a good heat-conducting compound, e.g. a setting potting compound, before insertion of the second cluster), and Electrical connection of contact pads on the top side of the first circuit carrier to the contact pads on the top side of the second circuit carrier(s).

The inventive circuit arrangement guarantees a good, more or less direct, heat dissipation from the component(s) in contact with the second circuit carrier to the heatsink. With the second circuit carrier, a "separation" can advantageously take place with respect to the component terminals that are in direct electrical contact with the contact pads on the underside of the second circuit carrier and pass through the second circuit carrier to contact pads on the top. Depending on the technology selected (e.g. LTCC) for the second circuit carrier, further electronic components or electronic functionalities can be integrated on or in this circuit carrier, such as for matching to a "peripheral electronic assembly" formed by the first circuit carrier complete with its population. Particularly for such an adaptation, it can also be provided that the second circuit carrier is also populated with at least one component on its side facing away from the heatsink. Such a population can, for example, take place at the same time as the production of the aforementioned second cluster, or also can be implemented later. However, it should be noted in this case that the heat dissipation capability for such additional components on the second circuit carrier is comparatively poor, so that this population location is suitable particularly for components that generate a substantially lower thermal power loss than the component(s) arranged under the second circuit carrier.

As claimed in the invention, a certain modularization of the overall construction advantageously results in that one or more electronic components (in a cluster with the second circuit carrier) are included in the circuit arrangement as a module. For the circuit components in question, this clearly has advantages with respect to repairability of the circuit arrangement (by replacement of modules) and also with regard to any changes in the circuit arrangement (population variants) that might occur later in practice. In the latter case, the modular construction under certain circumstances enables the further use of the peripheral electronic assembly (first circuit carrier complete with population) in conjunction with one or more modified modules (second circuit carrier complete with population).

The invention is explained in more detail in the following with the aid of an exemplary embodiment and with reference to the accompanying drawings. The drawings are as follows:

DESCRIPTION OF THE INVENTION

Figure 1:
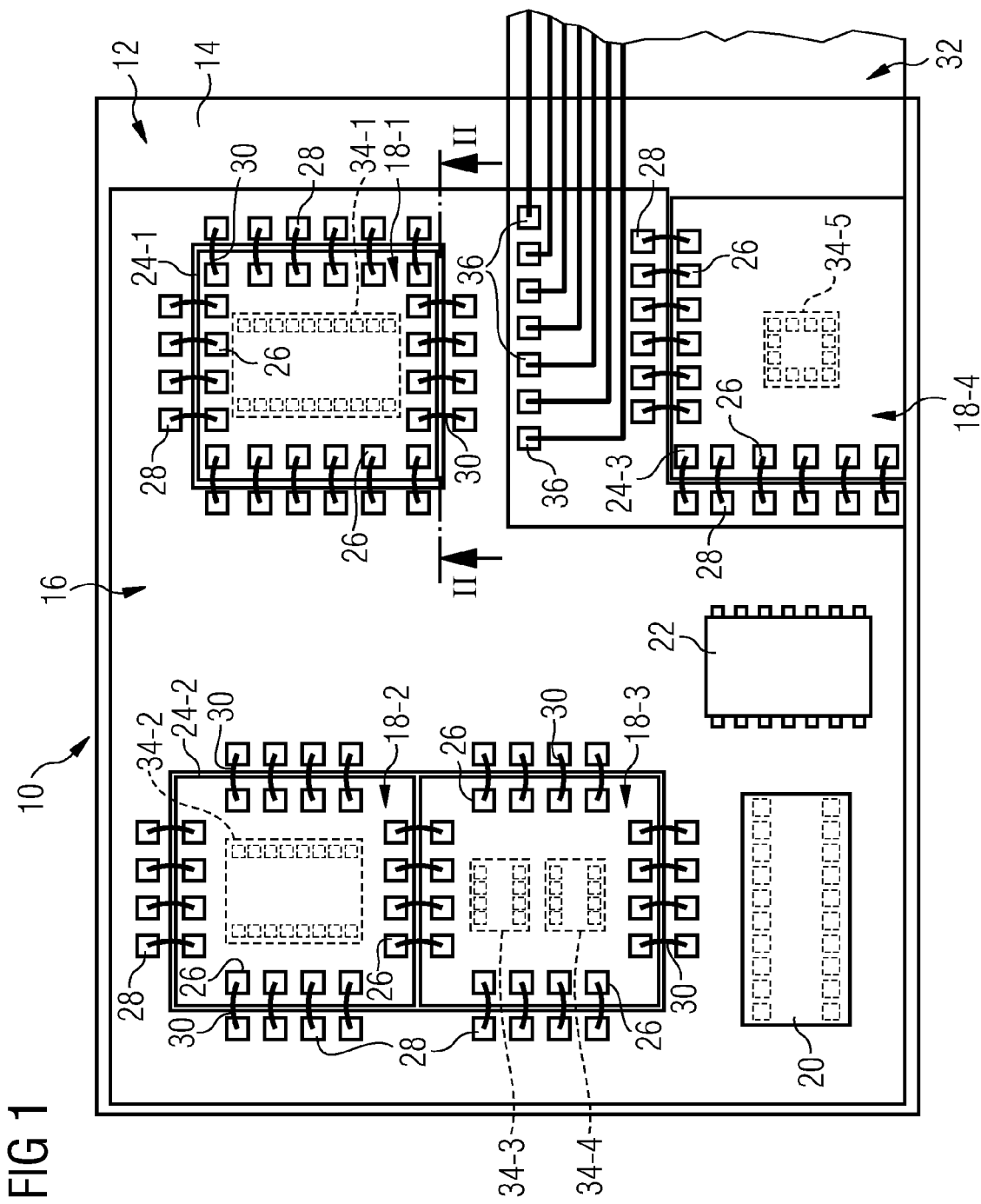
FIG. 1 A schematic plan view of a circuit arrangement, and
FIG. 2 A section view along line II-II in FIG. 1.

FIG. 1 shows a circuit arrangement 10 contained in a control unit for a motor vehicle transmission system, consisting of a heatsink 12 (which in the example shown forms part of a control unit housing), a first circuit carrier 16 lying flat on a top side 14 of the heatsink and thermally coupled to same, and a second circuit carrier 18-1, 18-2, 18-3 and 18-4.

The heatsink 12 is formed in a simple and efficient manner from a flat aluminum cast plate of uniform thickness that forms a base for the housing (not illustrated) accommodating the circuit arrangement. The thickness of the heatsink 12 is substantially greater than the thickness of the circuit carrier 16.

The first circuit carrier 16 is formed as a thick-layer ceramic. A common material for forming ceramic carrier plates is, e.g., $AL_2O_3$. Such thick-layer ceramics are known to persons skilled in the art of high-temperature electronics and therefore require no further explanation here.

Furthermore, the circuit arrangement 10 has a number of electronic components that are arranged as a unit in a manner known per se on the top side of the first circuit carrier 16 and are wired by said circuit carrier. Of this unit of components, only an unhoused integrated circuit 20 and a housed integrated circuit 22, fitted using flip-chip technology, are shown in the illustration by way of example.

In the case of flip chips, such as of chip 20, the connection to the circuit carrier is not generally formed by bonding but instead by direct adhesive or soldered joints between the contact pads of the chip and of the circuit carrier. The flip-chip technology thus enables a separation of the connections over the circuit carrier without bonded joints. A particular variant of this technology for the miniaturization of the electronic devices is "ball grid arrays" (BGAs), with which, instead of peripheral component terminals, the electric contact takes place via electrically conducting balls arranged in a point matrix. There are advantageously two dimensions available for this ball arrangement, which also enables the space-saving realization of a greater number of contacts.

A further part of the components of the circuit arrangement 10 (in this case in flip chip technology, alternatively e.g. BGA) is in contrast arranged on the underside of the second circuit carrier 18, which is accommodated in a recess 24-1, 24-2 and 24-3, passing through to the top side 14 of the heatsink 12.

The second circuit carriers 18 are designed as LTCC. Such multi-layer ceramic carrier plates produced in hybrid or microhybrid technology are known and in addition to their wiring function also enable the integration of other components in a three-dimension construction.

Each second circuit carrier 18 has contact pads 26 on its top side, which in each case are either electrically connected to such contact pads 26 of a second circuit carrier 18 arranged immediately adjacent in the same recess 24 or to contact pads 28 on the top side of the first circuit carrier 16.

In the example shown, the second circuit carriers 18-2 and 18-3 are jointly housed next to each other in a recess 24-2 provided in a central area of the first circuit carrier 16.

In contrast, the second circuit carriers 18-1 and 18-4 are housed in separately provided recesses 24-1 or 24-3, of which recess 24-3 is provided on the edge of the first circuit carrier 16.

In deviation from the illustrated exemplary example, a recess 24 provided to accommodate one or more second circuit carriers 18 can also be provided as an intermediate space between two first circuit carriers 16 arranged side by side and spaced apart.

The electrical connection between the second circuit carriers 18-1 and 18-2 and 18-3 on the one hand and the first circuit carrier 16 is realized in the illustrated exemplary example by bond wires 30 on the pads 26, 28, whereas the connection between the second circuit carrier 18-4 and the first circuit carrier 16 in this case is realized by a bonded printed conductor film 32 with corresponding printed conductors. After the bonding process, the bond wires 30 are then potted (mechanical protection and improvement in vibration resistance).

The components arranged on the undersides of the second circuit carriers 18 are indicated by 34-1 to 34-5 in the illustration. In the illustrated exemplary example, these components 34 are unhoused integrated circuits ("bare dies"), from which component terminals are electrically connected in flip chip technology to contact pads on the underside of the respective second circuit carrier 18 and whose underside lies flat against the top side 14 of the heatsink 12 and is thermally coupled with said heatsink 12.

Figure 2:
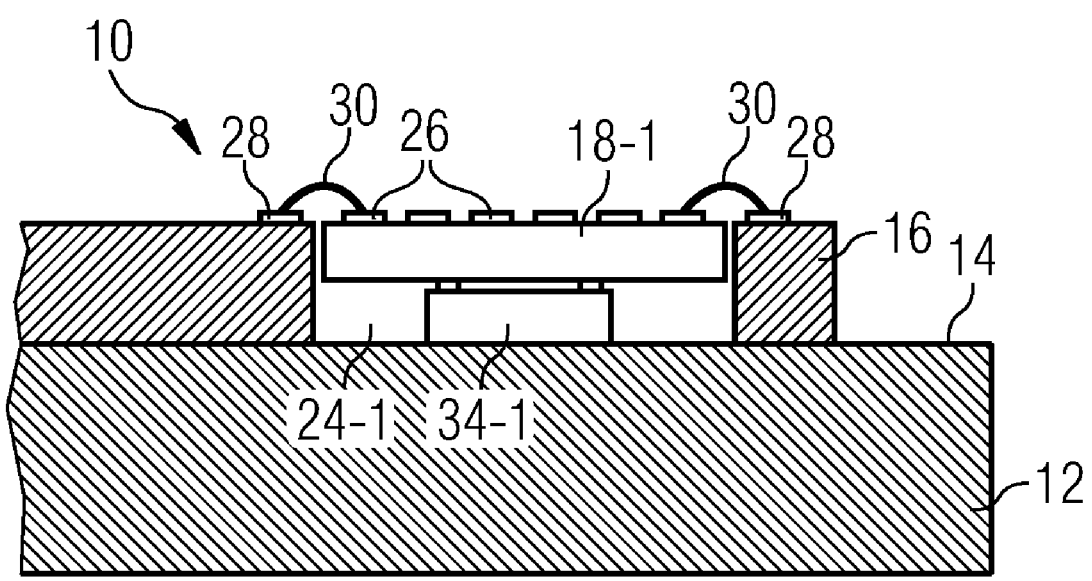

This arrangement of the components 34, which is very advantageous with respect to heat dissipation, can be particularly well seen in the example of the component 34-1 in the section view of FIG. 2. The underside of the chip 34-1 lies flat over its complete surface against the top side 14 of the heatsink 12, either directly or through a heat-conducting intermediate layer (e.g. adhesive layer, not illustrated). The electrically active areas of the component 34-1 are located in the top section thereof where the direct electrical contact to the second circuit carrier 18-1 takes place. Advantageously, there is only a slight thermal resistance between the thermally active area of the component 34-1 and the heatsink 12. An optimum coupling of the thermally active area of the component 34-1 and the heatsink 12 is thus achieved. Associated with this is the utilization of the application area of the relevant electronics up to higher ambient temperatures and/or higher power losses. In contrast to conventional flip chip constructions, the removal of the heat from the component is not via the circuit carrier, but instead the component is brought into an optimum thermal contact with a comparatively thick heatsink which has a large area.

With the arrangement for the second circuit carrier 18-3, shown in FIG. 1, of more than one component 34 under the circuit carrier (components 34-3 and 34-4), differences in height between these components can be compensated for by a potting compound, a conductive adhesive or similar or by grinding back the relevant component.

The second circuit carrier 18-1 provides an electrical wiring from the contact pads on the underside to the contact pads 26 on the top side of said circuit carrier 18-1, by means of which the aforementioned further contact (in this case to the contact pads 28 of the first circuit carrier 16) takes place. The same applies to circuit carriers 18-2, 18-3 and 18-4, not visible in FIG. 2.

A further type of electrical connection between the first circuit carrier and one of the second circuit carriers is shown in FIG. 1, in which the second circuit carrier 18-4 can be seen. In this case, the connection between the pads 26, 28 is realized by means of the bonded printed conductor film 32, which at the same time connects printed conductors to other pads 36 on the top side of the first circuit carrier 16, in order to connect the circuit arrangement 10 to an external line connection and/or other circuit carriers or circuit arrangements accommodated in the same electronic unit (control unit).

Although the technologies for implementing the circuit carriers 16 and 18 mentioned in the described exemplary embodiment are to be regarded as preferred, any of these circuit carriers can in principle also be produced by a different suitable technology which permits an arrangement and electrical wiring of components. For the second circuit carrier 18, HTCC (High Temperature Cofired Ceramics Technology) in particular can also be considered.

To produce the circuit arrangement 10, a first cluster consisting of the heatsink 12 and the first circuit carrier 16 is first produced, with the circuit carrier 16 being populated before or after with the components (20, 22, etc.) intended for the purpose. Furthermore, second clusters are produced, each of which consists of one of the second circuit carriers 18 and the component(s) (34) arranged thereon. These second clusters or modules are then inserted, with the components leading into the recesses 24 of the first circuit carrier 16, with a good heat-conducting adhesive material or a suitable potting compound being provided for attachment and/or improved thermal contact. The contact pads on the top side of the first circuit carrier 16 are then electrically connected to the adjacent contact pads on the top side of the second circuit carrier 18; in the above exemplary advantage this is achieved partially by the bond wires 30 and partially by the printed conductor film 32.

To summarize, an outstanding heat removal is achieved with the circuit arrangement 10 in the case of components 34 thermally coupled more or less directly to the heatsink. The particular configuration with respect to the arrangement of the components 34 is especially suitable both for standard chips and also for speciallt prepared flip chips. In one embodiment, it is provided that at least one of these components 34 is a power module (e.g. ASIC or switching transitor) or a microcontroller chip. Furthermore, these components 34, together with the associated second circuit carrier 18, can in practice be advantageously intergrated, as electronic modules changing over time, into the otherwise unchanged peripheral electronics, which were created from the first circuit carrier 16 components with its population. Also worth mentioning is the advantage that a rewiring of more complex microelectronic circuits (e.g. the aforementioned microcontrollers or other microprocessor devices) for matching to a peripheral electronic circuit or technology need no longer take place at wafer level, but instead can take place if necessary by means of the relevant second circuit carrier 18.

The invention claimed is:

1. An electronic circuit arrangement, comprising:
   a heat sink for dissipating heat, said heat sink having a top side;
   a first circuit carrier lying flat on said top side of said heat sink and being thermally coupled to said heat sink, said first circuit carrier having a top side carrying contact pads and having a recess formed therein passing through to said top side of said heat sink;
   a plurality of electronic components disposed on said first circuit carrier, said first circuit carrier wiring said plurality of electronic components;
   a second circuit carrier accommodated in said recess in said first circuit carrier, said second circuit carrier having a top side carrying contact pads and an underside with contact pads;
   a connection arrangement configured to electronically connect said contact pads on said top side of said first circuit carrier and said contact pads on said top side of said second circuit carrier; and
   an electronic component disposed between said second circuit carrier and said heat sink and having component terminals electrically connected to said contact pads on said underside of said second circuit carrier, said electronic component having an underside thermally coupled with said top side of said heat sink.

2. The circuit arrangement according to claim 1, wherein said heat sink is a metal plate.

3. The circuit arrangement according to claim 1, wherein said heat sink has a flat top side.

4. The circuit arrangement according to claim 1, wherein said first circuit carrier is plate-shaped.

5. The circuit arrangement according to claim 1, wherein said first circuit carrier is a thick-layer ceramic.

6. The circuit arrangement according to claim 1, wherein said second circuit carrier is plate-shaped.

7. The circuit arrangement according to claim 1, wherein said second circuit carrier is an LTCC or an HTCC.

8. The circuit arrangement according to claim 1, wherein said connection arrangement between said first circuit carrier and said second circuit carrier includes a bond wire arrangement.

9. The circuit arrangement according to claim 1, wherein said connection arrangement between said first circuit carrier and said second circuit carrier includes a printed conductor film.

10. The circuit arrangement according to claim 1, wherein said contact pads on said top of said first circuit carrier and of said second circuit carrier (18) are disposed at a substantially equal level.

11. The circuit arrangement according to claim 1, wherein said recess provided for accommodating the second circuit carrier (18) is formed in a central area of said first circuit carrier.

12. The circuit arrangement according to claim 1, wherein said electronic component disposed between said second circuit carrier and said heat sink is an unhoused chip.

13. The circuit arrangement according to claim 1, wherein said underside of said electronic component being ground.

14. The circuit arrangement according to claim 1, which comprises an amount of heat-conducting filling material coupling said electronic component to said top side of said heat sink.

15. The circuit arrangement according to claim 14, wherein said heat-conducting filling material is a heat-conducting adhesive layer.

16. A method of producing an electronic circuit arrangement, which comprises:
   providing a first cluster formed of a heat sink for dissipating heat and a first circuit carrier lying flat against a top side of the heat sink and being thermally coupled to the heat sink, the first circuit carrier having a recess formed therein passing through to the top side of the heat sink;
   disposing a plurality of electronic components on the first circuit carrier, and wiring the plurality of electronic components on the first circuit carrier;
   providing a second cluster formed of a second circuit carrier and an electronic component, the electronic component having terminals electrically connected to contact pads on the underside of the second circuit carrier;

inserting the second cluster into the recess of the first cluster such that the underside of the electronic component comes into thermal contact with the top side of the heat sink; and electrically connecting contact pads on the top side of the first circuit carrier to contact pads on the top side of the second circuit carrier.

17. The method according to claim 16, which comprises providing at least one of the plurality of electronic components on the first circuit carrier as an integrated circuit.

18. The method according to claim 16, which comprises:

providing a third circuit carrier including at least one electronic component;

providing the first circuit carrier with at least one additional recess; and fitting the third circuit carrier in the additional recess.

19. The circuit arrangement according to claim 1, wherein said plurality of electronic components, which are disposed on said first circuit carrier, includes at least one integrated circuit.

20. The circuit arrangement according to claim 1, further comprising:

a third circuit carrier including at least one electronic component;

said first circuit carrier including at least one additional recess, said third circuit carrier accommodated in said additional recess.

* * * * *